United States Patent [19]
Doche

[11] Patent Number: 5,509,772
[45] Date of Patent: Apr. 23, 1996

[54] SYSTEM FOR THE HANDLING AND CONFINEMENT OF FLAT OBJECTS IN INDIVIDUAL BOXES

[75] Inventor: Claude Doche, Claix, France

[73] Assignee: Commissariat a l'Energie Atomique, Paris, France

[21] Appl. No.: 132,696

[22] Filed: Oct. 6, 1993

[30] Foreign Application Priority Data

Oct. 16, 1992 [FR] France .................................. 92 12422

[51] Int. Cl.⁶ .................................................. B65G 1/08
[52] U.S. Cl. .......................... 414/217; 414/411; 414/416; 414/937; 414/940; 414/939
[58] Field of Search .................................. 414/217, 222, 414/416, 411, 937, 939, 940; 204/298.25, 298.35

[56] References Cited

U.S. PATENT DOCUMENTS

| | | | |
|---|---|---|---|
| 4,715,764 | 12/1987 | Hutchinson | 414/217 |
| 4,717,461 | 1/1988 | Strahl et al. | 204/192.1 |
| 4,724,874 | 2/1988 | Parikh et al. | 414/217 X |
| 4,764,076 | 8/1988 | Layman et al. | 414/217 |
| 4,776,745 | 10/1988 | Foley | 414/939 X |
| 4,901,011 | 2/1990 | Koike et al. | 414/937 X |
| 4,995,430 | 2/1991 | Bonora et al. | 414/217 X |
| 5,067,218 | 11/1991 | Williams | 414/217 X |
| 5,137,063 | 8/1992 | Foster et al. | 414/217 X |
| 5,145,303 | 9/1992 | Clarke | 414/217 |
| 5,273,423 | 12/1993 | Shiraiwa | 414/217 X |
| 5,382,127 | 1/1995 | Garric et al. | 414/217 |

FOREIGN PATENT DOCUMENTS

| | | |
|---|---|---|
| 0273791 | 11/1987 | European Pat. Off. . |
| 0412945 | 8/1990 | European Pat. Off. . |
| 2626528 | 12/1976 | Germany . |
| 44036 | 2/1989 | Japan ................ 414/217 |
| 44035 | 2/1989 | Japan ................ 414/940 |
| 2143910 | 2/1985 | United Kingdom ... 414/217 |
| 9104213 | 4/1991 | WIPO ................ 414/217 |
| 9202950 | 2/1992 | WIPO . |

OTHER PUBLICATIONS

Patent Abstracts of Japan—vol. 7, No. 148—Jun. 29, 1983.

Primary Examiner—David A. Bucci
Attorney, Agent, or Firm—Pearne, Gordon, McCoy & Granger

[57] ABSTRACT

The system according to the invention makes it possible to handle and transfer flat objects under an ultraclean atmosphere without using white rooms. It essentially comprises interfaces (5) making it possible to receive individual boxes (1), each of which contains a flat object, opening each box and feeding each flat object into a working station (6A). The system is completed by tunnels (4) making it possible to transfer the flat objects from one working station (6A, 6B) to another.

4 Claims, 3 Drawing Sheets

1

SYSTEM FOR THE HANDLING AND CONFINEMENT OF FLAT OBJECTS IN INDIVIDUAL BOXES

BACKGROUND OF THE INVENTION

1. Field of the Invention

The invention relates to the manufacture, preparation and treatment of flat objects, such as silicon wafers, under a special, ultraclean atmosphere. The silicon wafers in question are used for the manufacture of integrated circuits in the electronics and microelectronics field. Other applications can be envisaged, particularly under a vacuum.

2. Description of Related Art

The manufacture of electronic circuits on circular silicon wafers requires the latter to be treated under a special atmosphere and handled and stored under an ultraclean atmosphere, i.e. surrounded by controlled nitrogen or highly pure air. Up to now several system concepts have been used.

A first concept consists of placing the room where the silicon wafers are treated under the ultraclean atmosphere in question, i.e. under a controlled atmosphere. This leads to large air filtration/ventilation installations and sophisticated clothing for each operator working in the room.

Another concept consists of placing under the controlled atmosphere only the points at which the silicon wafers are stored and handled. These are the working stations and storage containers. The transportation of the wafers from one working station to another or from a storage station to a working station takes place by means of containers equipped with cassettes or cases having a shelf system able to receive between ten and thirty superimposed silicon wafers. These generally tight containers can even be equipped with their own ultraclean air supply system.

The aim of the invention is to propose another silicon wafer handling system concept. With regards to the fragility and treatment conditions, these silicon wafers can be likened to digital optical disks and to compact audiodigital disks.

SUMMARY OF THE INVENTION

Therefore the main object of the invention is a system for handling flat objects confined in an ultraclean atmosphere in individual boxes in order to bring the objects into at least one working station whilst ensuring the perfect continuity of the objects where a special atmosphere is provided. Such a system comprises individual tight boxes containing an ultraclean atmosphere, means for moving said boxes into an ordinary atmosphere, interfaces between the displacement means and the working stations for the flat objects, in which the boxes are opened and the flat objects extracted therefrom and are maintained under an ultraclean atmosphere throughout the time when they are located within the working means, tunnels for the displacement of the flat objects in order to rigidly connect two working stations whilst maintaining the objects under an ultraclean atmosphere and means for the management and control of the displacement or movement of the boxes.

The individual box is preferably extraflat and has a concealable door.

In its preferred embodiment, the interface comprises a body constituting an access tunnel equipped with a pick and place robot for inserting the objects and acting within said tunnel in order to make an object pass through the latter, an adapting bottom plate fixed to a first end of the body and having fixing means matched to those of the outlet of a working station, ensuring the mechanical positioning of the interface with respect to the working station and a modular bottom plate for positioning and opening the boxes and enabling the robot to seize the objects, as well as for ensuring the reverse operations.

In this case, the body preferably comprises means for protecting the objects supplied by the nitrogen or ultraclean air feed pipe.

The adapting bottom plate preferably comprises a door system for isolating the working station.

The modular bottom plate preferably comprises ventilation connection means for the boxes, means for opening the boxes in order to tightly link the interior of the boxes with the body, means for positioning the boxes on the box opening means and means for the exchange of informations with the management and control means.

For boxes having a descriptive card, the modular bottom plate can have means for the reading and updating of the informations on said card.

The positioning means preferably have a horizontal piston pushing the boxes into an anchoring hole.

The tunnels preferably comprise the three following elements fixed to one another, namely at least one relay module constituted by a tunnel section, at least two robot modules, each fixed to the outlet of a working station and to a transfer module for transferring the flat objects located at the outlet of the working stations to another robot module across a relay module and means for protecting the objects supplied by a nitrogen or ultraclean gas source.

BRIEF DESCRIPTION OF THE DRAWINGS

The invention is described in greater detail hereinafter relative to a non-limitative embodiment and the attached drawings, wherein show.

DETAILED DESCRIPTION OF AN EMBODIMENT OF THE INVENTION

Figure 1:
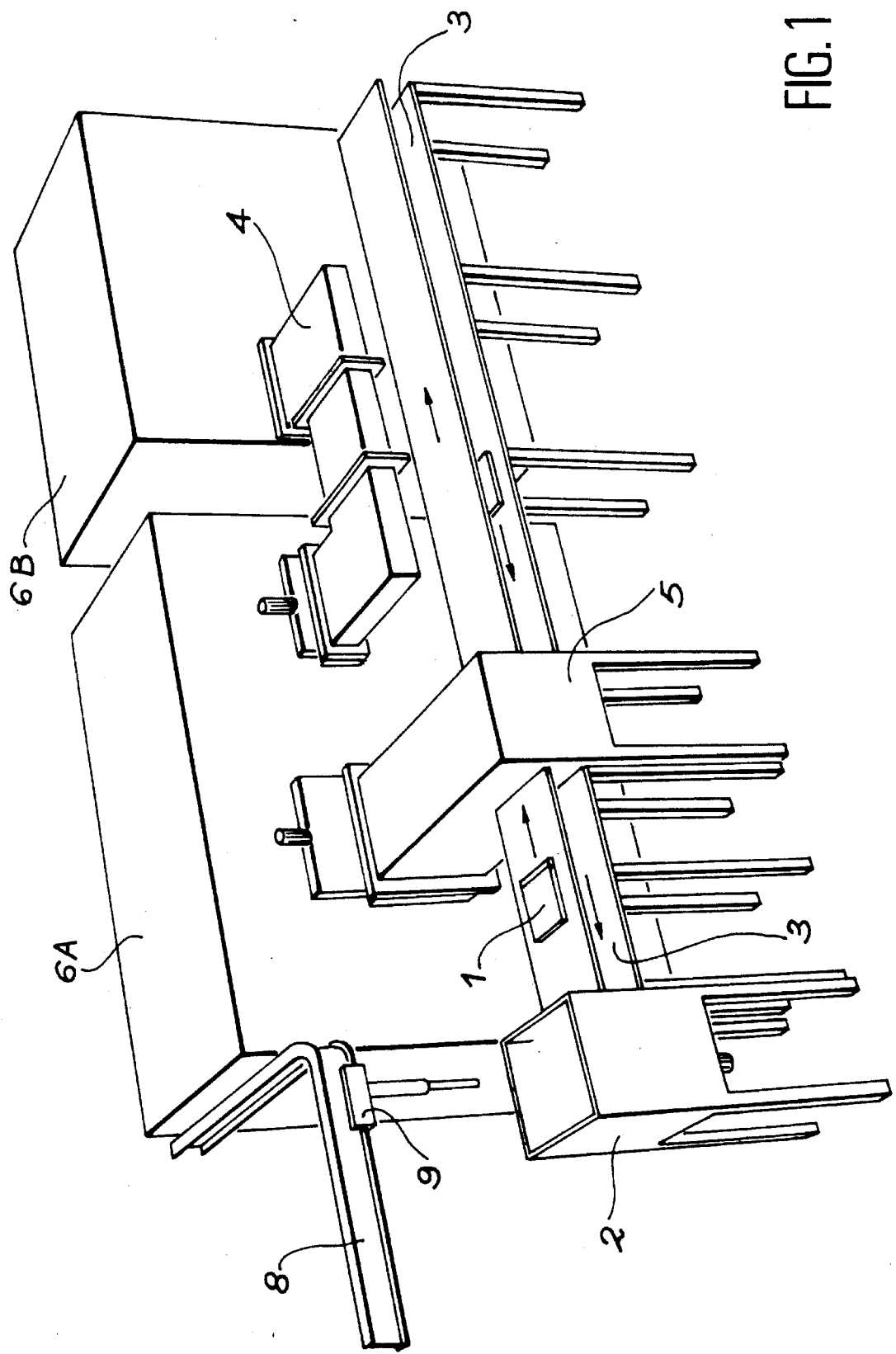
FIG. 1 The general system according to the invention.

FIG. 1 shows two working stations 6A, 6B within which take place operations on very fragile flat objects, such as silicon wafers, under special working conditions, particularly with respect to the atmosphere which is often of a special nature therein. Outside these working stations, each of the objects is stored and handled in an individual box. The storage and transportation of these boxes takes place manually or automatically. For example, the objects can be passed to the working stations 6A, 6B by different elements, such as displacement elements 3, e.g. constituted by a conveyor having one or more belts or paths.

According to the invention, interfaces 5 are provided for bringing about the ventilation transition between these displacement elements 3 and the working stations 6A, 6B.

Each of the boxes 1 contains a flat object, such as a silicon wafer or flat screen, which are maintained under an ultraclean atmosphere. Said flat box 1 can also contain a flat disk, such as a compact disk or a digital optical disk.

The flat objects, such as silicon wafers, are therefore constantly confined in an ultraclean atmosphere in their individual box 1 and in a special atmosphere within the working stations 6A, 6B, when they are in each case extracted from their individual box 1. Obviously, all the confinement elements are tight.

According to the invention, only the interior of the working stations 6A, 6B, interfaces 5 and tunnels 4 is maintained under a special atmosphere, because each flat object is tightly enclosed in its individual box 1 during storage and transportation. When the box is opened for the introduction or removal of a flat object, a ventilation system within the box is put into operation. An ultraclean gas or nitrogen hydraulic feed pipe provided on the side opposite to the door of the box can therefore prevent the entry of ambient gas via the box door.

Thus, the system in question only involves a minimum volume quantity confined under an ultraclean or nitrogen and special atmosphere. Moreover, no problems are encountered in handling or manipulating the extraflat boxes 1, because it is possible to give them the standard external shape appropriate for their handling and storage.

This flat object handling concept, such as silicon wafers in individual boxes 1, is contrary to certain ideas where the silicon wafers are collectively protected, i.e. never surrounded by an individual envelope. In the concept of the invention, the assembly constituted by the flat object/individual box 1 constitutes an inseparable pair throughout the flat object treatment or manufacturing cycle.

Obviously, each individual box 1 has a concealable door compatible with opening and closing systems used in the system according to the invention. Thus, each object can be extracted and reintroduced with respect to its individual box 1.

The displacement management and control means for said boxes are not shown, but obviously form part of the system. FIG. 1 also shows a horizontal handling ramp 8 on which is suspended a conveying carriage 9 making it possible to introduce into a storage element 2 a cassette or pack of individual boxes 1.

Figure 2:
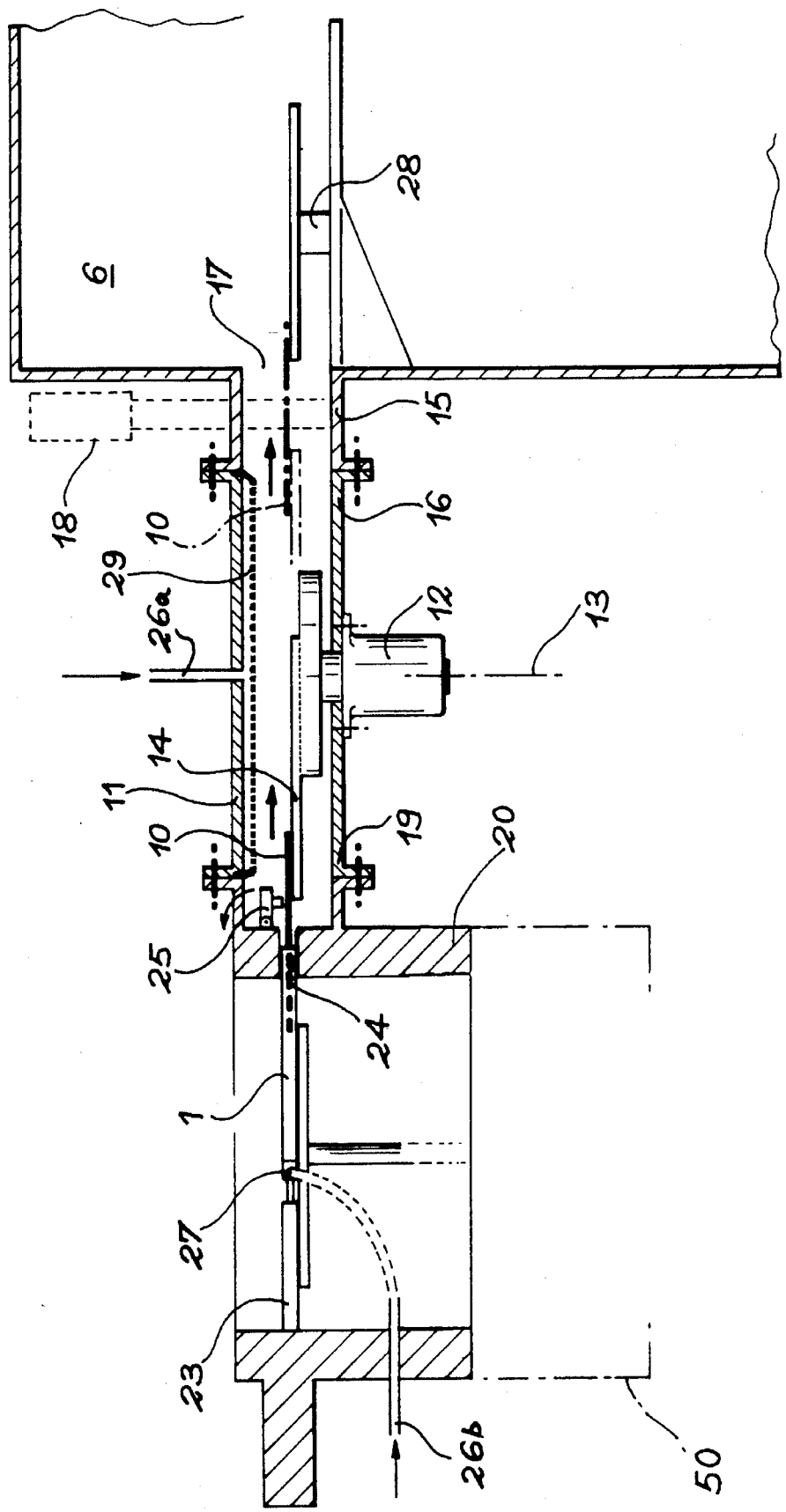
FIG. 2 In section an embodiment of the interface used in the system according to the invention.

With reference to FIG. 2, one of the essential elements of the invention is an interface, which forms the transition between the conveying means and the work stations.

A first part of the interface is constituted by a body 11, which is a tunnel portion having to be traversed by the flat objects 10. It constitutes an access tunnel to the working station 6. Such a body 11 is equipped with a robot 12, e.g. a pick and place robot marketed by BROOKS and ADE. Such a robot 12 serves as a relay for introducing the object 10 into a working station 6. Thus, by a rotary movement about a vertical axis 13 and an articulation movement of its arm 14 placed within the body 11, said robot 12 can make a flat object 10 pass through the body 11.

The flat object 10 is protected against contamination by a permanent scavenging with air or nitrogen over the entire inside of the body 11. This scavenging action can be laminar, parallel or transverse to the plane of the flat object 10. The air flow can e.g. be produced by means of a diffuser 29 located within the body 11 and supplied with ultrapure air or nitrogen 26a.

Another part of said interface is constituted by an adapting bottom plate 15 fixed to a first end 16 of the body 11. This bottom plate 15 is also fixed to the inlet 17 of a working station 6. Preferably, said bottom plate 15 has a door 18 making it possible to isolate the volume within said working station 6 with respect to the internal volume of the interface. Thus, the working atmosphere is generally special and not ultraclean. It is therefore necessary to purge the volume of the interface in order to fill it with said special atmosphere before opening the door 18.

The third part of the interface is constituted by a modular bottom plate 20 fixed to the second end 19 of the body 11. It essentially comprises means for the ventilation connection of boxes, means for the positioning of the boxes, means for opening the boxes and means for exchanging information with the management and control means.

Although it is possible to manually load the boxes 1 onto the modular bottom plate 20, the latter is usually placed on the path of the box displacement means with a view to intercepting those whereof the objects contained therein have to undergo a treatment in the corresponding working station. This bottom plate 20 is then mounted on a special module of the displacement system making it possible to automatically extract the boxes 1 from the conveying system. The modular bottom plate 20 associated with the special module 50 constitutes an intermediate element in the box displacement means.

For forming the positioning means for the boxes 1, a horizontal piston 23 is provided for pushing the box 1 towards an anchoring and positioning hole 24. The opening door of the box 1 is then contacted with the closing door 19 of the modular bottom plate 20. Means are provided for the simultaneous opening of the two doors in order to trap any contamination present at the interface. This opening makes it possible to link the internal volume of the box 1 with the internal volume of the body 11. A nitrogen or pure air flow is then progressively established in the box 1 during said opening in order to protect the object 10 against all possible contamination sources. A ventilation system is established between the box 1 and the body 11 in order to guarantee the protection of the object 10 throughout its transfer to the working station. These opening means can be constituted by a device 25 placed at the end of the bottom plate 20, above or below the anchoring hole 24. The opening of the two integral doors can take place by pivoting or translation.

The modular bottom plate 20 can also incorporate means for exchanging information with the control means. Such as in the case where each of the boxes 1 has a descriptive card, it is possible to provide means for reading and updating the information contained in said card of the box 1. These means can be placed on the horizontal piston 23 in order to be able to communicate with the rear of the box 1.

As the boxes 1 have internal ventilation means, the modular bottom plate 20 has ventilation connection means to said boxes 1. These ventilation connection means can be in the form of a nitrogen or ultraclean gas feed pipe 26b, which can be connected to the internal ventilation means of the boxes 1. A ventilation connection 27 of the feed pipe 26 is fixed to the piston 23 and can be engaged against a ventilation inlet of the box 1.

The thus described interface functions as follows. The box 1 is automatically or manually positioned around the anchoring hole 24. The horizontal piston 23 then pushes the box 1 into the anchoring hole 24 until the latter assumes a predetermined translation position defined by the travel of the p is ton 23.

The opening of the box 1 can then take place by means of the system 25, which downwardly ratchets or pivots to seize the door of the box 1. The opening system 25 then upwardly ratchets or pivots to open the door of the box 1 and link the internal volume of the box 1 with the internal volume of the body 11. The interior of the box 1 is then placed under a ventilation circulation by means of the connection 27.

The arm 14 of the robot 12 equipped with gripping means can then seize the flat object 10 contained within the box 1. A rotation about the vertical axis 13 of the robot 12 and/or an articulation of the arm 14 makes it possible to position the flat object on a support 28 located at the inlet of the working station. The reverse operation can take place in order to replace the object within the individual box 1, the latter then being closed again.

Thus, such a modular bottom plate makes it possible to construct an interface able to fulfil various functions:

the compatibility of the boxes 1 controlled by the system, the ratching or locking of the box 1 on the opening means 25, the ventilation connection of each box 1 to the nitrogen or pure air distribution network, the possible checking of certain physicochemical parameters within the box 1, the opening and closing mechanism for the box 1, the control of the transfer of the silicon wafer from the box 1 to the working station 6, information exchanges with the control system and with a possible automatic box distribution system.

Figure 3:
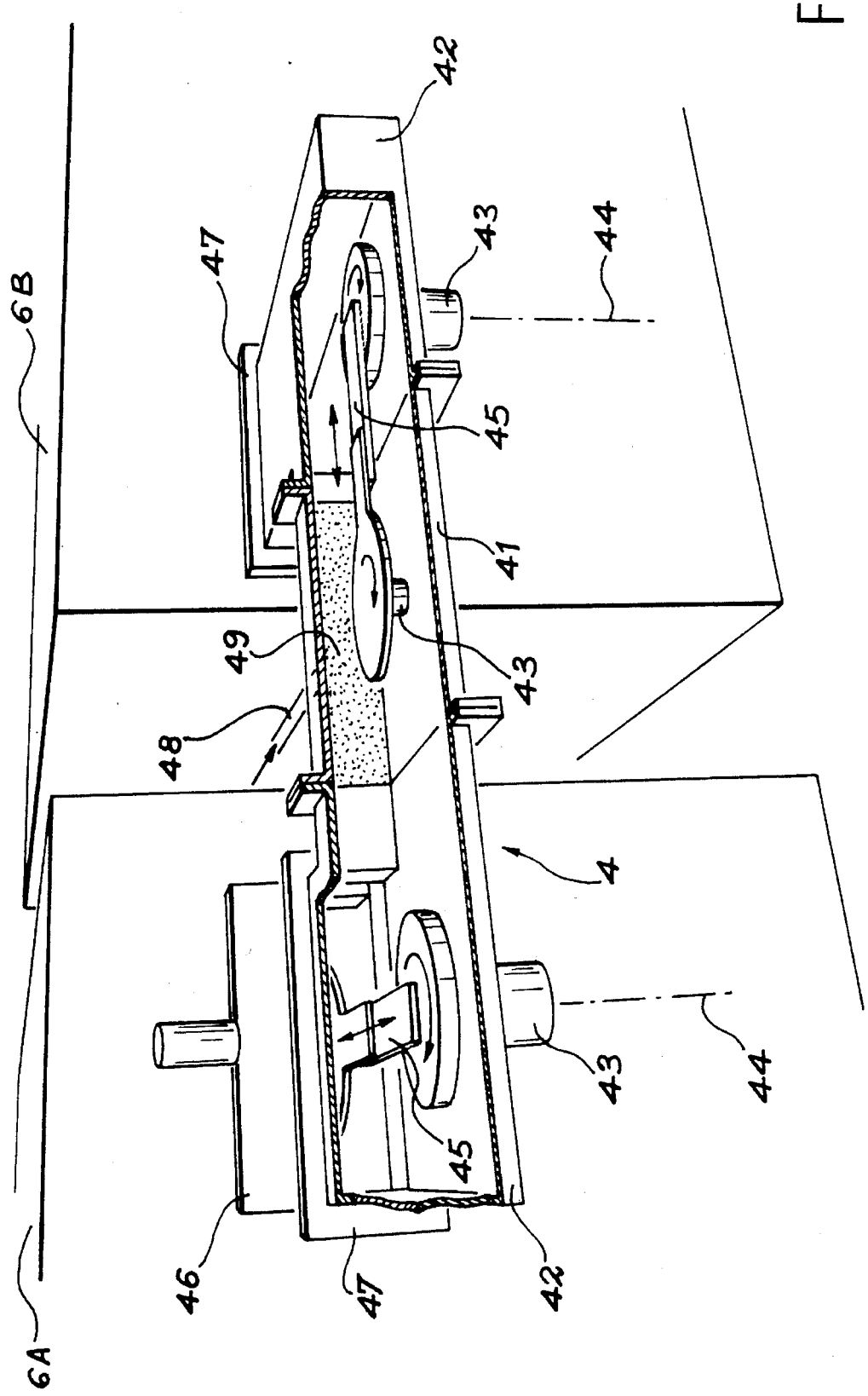
FIG. 3 A displacement tunnel used in the system according to the invention.

FIG. 3 shows a construction of a tunnel 4 of the system according to the invention. Such a tunnel is constructed from two basic module types constituted by two cornering modules 42 between which is placed a relay module 41. As shown in FIG. 3, each cornering module 42 is fixed to a working station 6A or 6B by fixing means 47 adapted to the inlet of said station 6A and 6B. These fixing means can be completed by a door system 46 for isolating either the tunnel 4, or the working station 6A or 6B in the same way as in the door system used in the bottom plate of the interface. Thus, the tunnel 4 or the working station or stations 6A, 6B can be isolated from one another from the ventilation standpoint. If there is a significant difference between the stations 6A and 6B, it is possible to extend the tunnel 4 using the above-described body modules 11, which will hereinafter be referred to by the term "straight" body module. A relay module 41 is indispensable between two body modules.

The flat object 10 is protected against contamination when transferred within the tunnel 4 by the different pick and place robots 43 equipping the body modules 11 or 42 by means of a permanent air or nitrogen scavenging. The body modules 11, 42 and relay module 41 are equipped with a ventilation device ensuring said protection. This device can be constituted by a diffuser 49 positioned parallel or perpendicular to the object and supplied with ultraclean air or nitrogen by a ventilation feed pipe 48. These devices are designed in such a way that there is no turbulence at the different interfaces.

The tunnel 4 is represented in such a way as to show its inside. Thus, it is possible to see within each of the cornering modules 42 a robot 43 identical to that installed in the interface body. Each robot is of the pick and place type. In other words it permits a rotary movement about a vertical axis 44 and horizontal translation movements. Thus, each of the cornering modules 42 is constituted by a right-angled tunnel section, each of said robots can transfer a flat object from the interior of a working station 6A or 6B to the relay module 41. For this purpose it is merely necessary to seize the flat object by the end of the arm 45, bring it to the centre of the robot, perform a 90° rotation, extend the arm 45 in the direction of the relay module 41, where it can be placed on a support of said module 41. Thus, the silicon wafers can easily be transferred from one working station 6A to another 6B. It is also possible to intercalate relay modules 41 with modules like the interface body modules 11 of FIG. 2 for forming a longer tunnel portion.

Thus, two working stations 6A, 6B can be combined in a so-called "rigid" manner. Thus, it is possible to easily produce active tunnels within which circulates the ultraclean air or nitrogen. It is even possible to provide tunnels able to withstand a partial vacuum. Thus, by providing the system with pumps and ensuring a high level sealing action, said system can carry out vacuum treatment and/or manufacturing applications.

The system according to the invention has been described in its realization intended for silicon wafers requiring extreme cleanness conditions. In general terms, the system according to the invention can be used for handling even large flat objects possibly requiring equivalent purity and cleanness conditions. This is the case with flat screens. The application to compact disks can also fall within the scope of the applications of a system according to the invention. By using tight closing elements, the system according to the invention can be used for the handling of objects under a vacuum.

What is claimed is:

1. System for handling flat objects (10) confined in an ultraclean atmosphere in individual boxes (10) in order to bring the objects (10) into working stations (6, 6A, 6B) where there is a special atmosphere, said system comprising:

individual boxes (1) in which there is an ultraclean atmosphere, each of said boxes being flat having a concealable door and receiving one of said flat objects;

means (3) for displacing said boxes (1) in an ordinary atmosphere;

an interface (5) between the displacement means (3) and an associated one of said working stations (6, 6A, 6B) in which the boxes (1) are opened and the flat objects (10) are extracted from the boxes (1) and kept under a special atmosphere throughout the time which they spend within the working stations (6, 6A, 6B), said interface (5) including a body (11) having an access tunnel, a pick and place robot (12) acting within said access tunnel for passing said objects (10) through said access tunnel, an adapting bottom plate (15) fixed to a first end (16) of the body (11) and to an inlet (17) of the associated one of said working stations (6) to ensure mechanical positioning of the interface (5) relative to the associated one of said working stations (6), and a modular bottom plate (20), said modular bottom plate (20) having means for connecting a feed pipe to a ventilation connection (27) of the boxes (1), and means (25) for opening the boxes (1) to tightly link an interior of said boxes (1) with the body (11); and a transfer tunnel (4) rigidly connecting two of said working stations (6A, 6B) for transferring said objects (1) between said working stations while keeping said objects under an ultraclean atmosphere.

2. System according to claim 1, wherein said body (11) comprises means for protecting the objects (10) supplied by a nitrogen or ultraclean air feed pipe (26a).

3. System according to claim 1, wherein said adapting bottom plate (15) has a door system (18) for isolating the working station (6) from the body (11).

4. System according to claim 1, wherein said transfer tunnel (4) comprises at least one relay module (41) having a tunnel section, at least two cornering modules (42) each fixed to an outlet of a working station (6A, 6B) and to the relay module (41) for transferring the flat objects positioned at the outlet of the working stations (6A, 6B) across the relay module (41), and means for protecting the objects (10) being supplied by an ultraclean air or nitrogen feed pipe (48).

* * * * *